United States Patent
Yang et al.

(10) Patent No.: US 7,468,866 B2
(45) Date of Patent: Dec. 23, 2008

(54) FLEXIBLE PRINTED CIRCUIT FOR HEAD GIMBAL ASSEMBLY

(75) Inventors: Huai Yang, GuangDong (CN); HaiMing Zhou, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 519 days.

(21) Appl. No.: 11/368,997

(22) Filed: Mar. 7, 2006

(65) Prior Publication Data
US 2007/0211386 A1    Sep. 13, 2007

(51) Int. Cl.
*G11B 5/48* (2006.01)
(52) U.S. Cl. ................................... 360/245.9
(58) Field of Classification Search ............. 360/245.9, 360/245.3, 256, 323, 234.5, 264.2
See application file for complete search history.

(56) References Cited

U.S. PATENT DOCUMENTS

| | | | |
|---|---|---|---|
| 5,768,062 A * | 6/1998 | Anderson et al. | 360/245.9 |
| 6,543,673 B2 | 4/2003 | Lennard et al. | |
| 6,614,624 B2 * | 9/2003 | Shiraishi et al. | 360/245.9 |
| 6,839,204 B2 * | 1/2005 | Shiraishi et al. | 360/245.9 |
| 2002/0041469 A1 * | 4/2002 | Shiraishi et al. | 360/245.9 |
| 2002/0071218 A1 * | 6/2002 | Shiraishi et al. | 360/245.9 |
| 2004/0228038 A1 | 11/2004 | Nakamura et al. | |
| 2005/0078416 A1 * | 4/2005 | Shiraishi et al. | 360/245.9 |

* cited by examiner

*Primary Examiner*—Allen T Cao
(74) *Attorney, Agent, or Firm*—Nixon & Vanderhye P.C.

(57) ABSTRACT

A head gimbal assembly includes a slider, a suspension to support the slider, and a flexible printed circuit provided to the suspension. The flexible printed circuit includes multiple traces to electrically connect the slider to a conductive tab and a test tab. The flexible printed circuit includes a grounding trace to ground the flexible printed circuit at the test tab.

17 Claims, 5 Drawing Sheets

FLEXIBLE PRINTED CIRCUIT FOR HEAD GIMBAL ASSEMBLY

FIELD OF THE INVENTION

The present invention relates to a head gimbal assembly (HGA) of an information recording disk drive device and, more particularly, to a flexible printed circuit of the head gimbal assembly.

BACKGROUND OF THE INVENTION

FIG. 1 illustrates a conventional head gimbal assembly (HGA) 100 for a disk drive device. As illustrated, the head gimbal assembly 100 includes a suspension 102 that supports a magnetic head slider having magnetic read/write elements. A flexible printed circuit (FPC) 104 is provided to the suspension 102 and electrically connects the slider and its read/write elements to a plurality of connection pads 106 (which connect to an external control system). In order to examine or test the dynamic and/or static characteristics of the magnetic read/write elements on the slider before the HGA 100 is assembled to the disk drive device, a test tab 108 including test pads 109 is electrically connected to the FPC 104.

Magneto resistive (MR) and giant magneto resistive (GMR) heads include an MR element or GMR element for reading data from a disk. The MR/GMR element on the head is very sensitive to damage due to electrostatic discharge (ESD). To prevent from this damage, it is known to shunt the MR/GMR element through leads (traces) of the MR/GMR element on the suspension during manufacturing. However, it is not known to protect the MR/GMR element from ESD during testing.

An exemplary shunt system is disclosed in U.S. Pat. No. 6,543,673 wherein the shunt is removed for a testing operation. U.S. Patent Application Publication No. 2004/0228038 discloses stacked support portions of resin layers on both sides of a flying lead of a long-tail FPC that are reinforced with metal frames to strengthen the flying lead.

Thus, there is a need for an improved system for protecting a slider from ESD during manufacturing and testing processes.

SUMMARY OF THE INVENTION

One aspect of the present invention relates to a head gimbal assembly (HGA) including a flexible printed circuit (FPC) that protects a slider from ESD during manufacturing and testing processes.

Another aspect of the present invention relates to a head gimbal assembly (HGA) including a flexible printed circuit (FPC) with a grounding trace or lead.

Another aspect of the invention relates to a head gimbal assembly including a slider, a suspension to support the slider, and a flexible printed circuit provided to the suspension. The flexible printed circuit includes multiple traces to electrically connect the slider to a conductive tab and a test tab. The flexible printed circuit includes a grounding trace to ground the flexible printed circuit at the test tab.

Another aspect of the invention relates to a flexible printed circuit for a head gimbal assembly. The flexible printed circuit includes multiple traces extending from a suspension of the head gimbal assembly, through a conductive tab, and to a test tab. The flexible printed circuit includes a grounding trace to provide grounding at the test tab.

Yet another aspect of the invention relates to a method for testing a slider. The method includes grounding a flexible printed circuit that electrically connects the slider to a test tab, and testing the dynamic and/or static characteristics of the slider while the flexible printed circuit is grounded.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
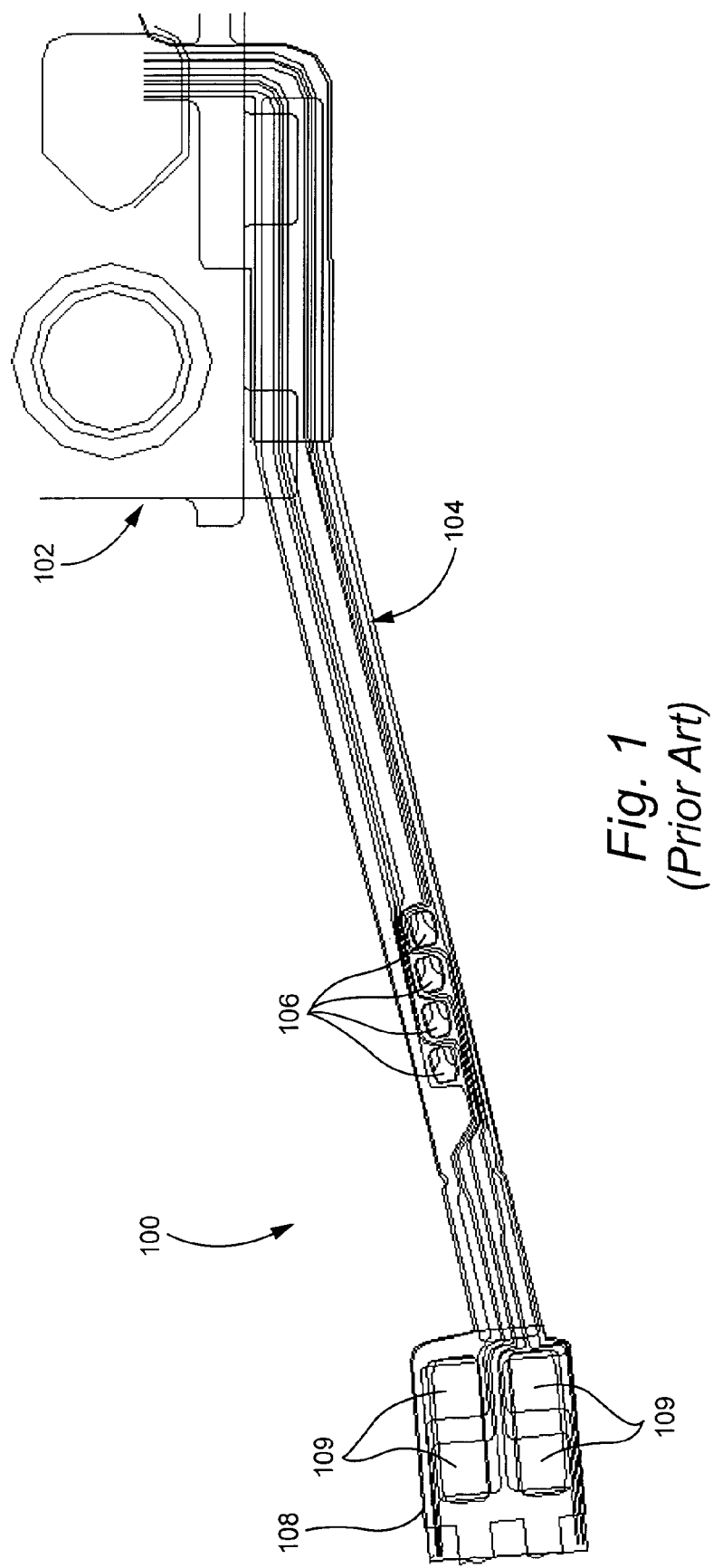
FIG. 1 is a partial top view of a conventional head gimbal assembly (HGA) including a conventional flexible printed circuit (FPC)

An embodiment of the present invention will now be described with reference to the figures, wherein like reference numerals designate similar parts throughout the various views. As indicated above, the present invention is designed to protect a slider from ESD during manufacturing and testing processes. An aspect of the present invention is to provide a head gimbal assembly (HGA) including a flexible printed circuit (FPC) with a grounding trace or lead. The grounding trace or lead grounds the FPC during manufacturing and testing processes to prevent ESD damage.

FIGS. 2-7 illustrate a head gimbal assembly (HGA) 210 incorporating a flexible printed circuit (FPC) 212 according to an exemplary embodiment of the present invention. The HGA 210 includes a slider 214, a suspension 216 to support the slider 214, and a FPC 212 provided to the suspension 216.

Figure 2:
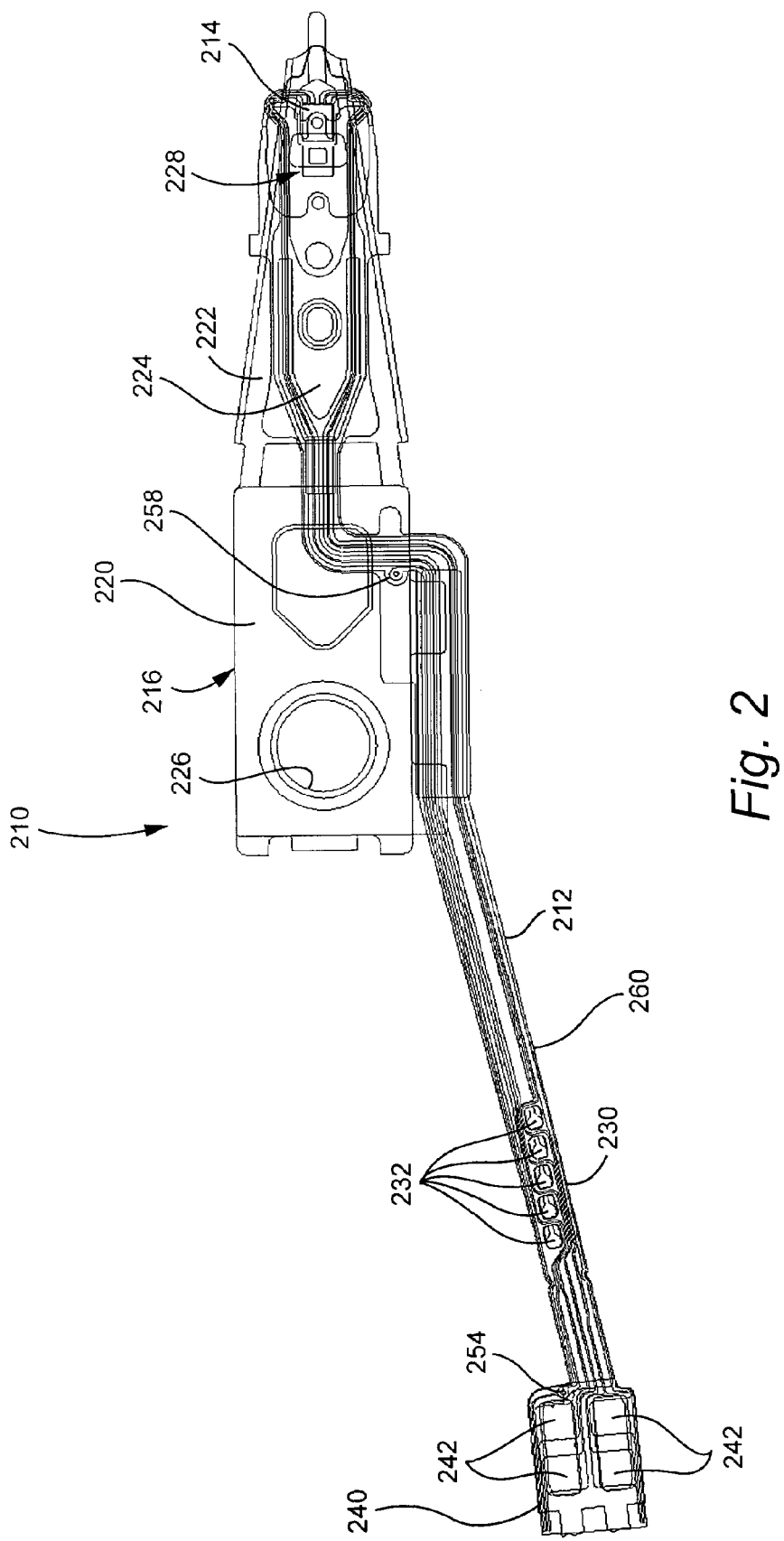
FIG. 2 is a top view of a head gimbal assembly (HGA) including a flexible printed circuit (FPC) according to an embodiment of the present invention.

As best shown in FIG. 2, the suspension 216 generally includes a base plate 220, a load beam 222, and a flexure 224. The base plate 220 includes a mounting hole 226 for use in connecting the suspension 216 to a drive arm of a voice coil motor (VCM) of a disk drive device. The shape of the base plate 220 may vary depending on the configuration or model of the disk drive device. Also, the base plate 220 is constructed of a relatively hard or rigid material, e.g., metal, to stably support the suspension 216 on the drive arm of the VCM.

The load beam 222 is provided to the base plate 220. The load beam 222 may have a dimple formed thereon to apply the gram load to the slider 214. The flexure 224 is welded to the load beam 222 for supporting the slider 214.

The flexure 224 is provided to the base plate 220 and the load beam 222. The flexure 224 provides a region or tongue 228 for supporting the slider 214 on the suspension 216. In an embodiment, the slider 214 may be supported on the suspension 216 by a micro-actuator as is known in the art.

Figure 3:
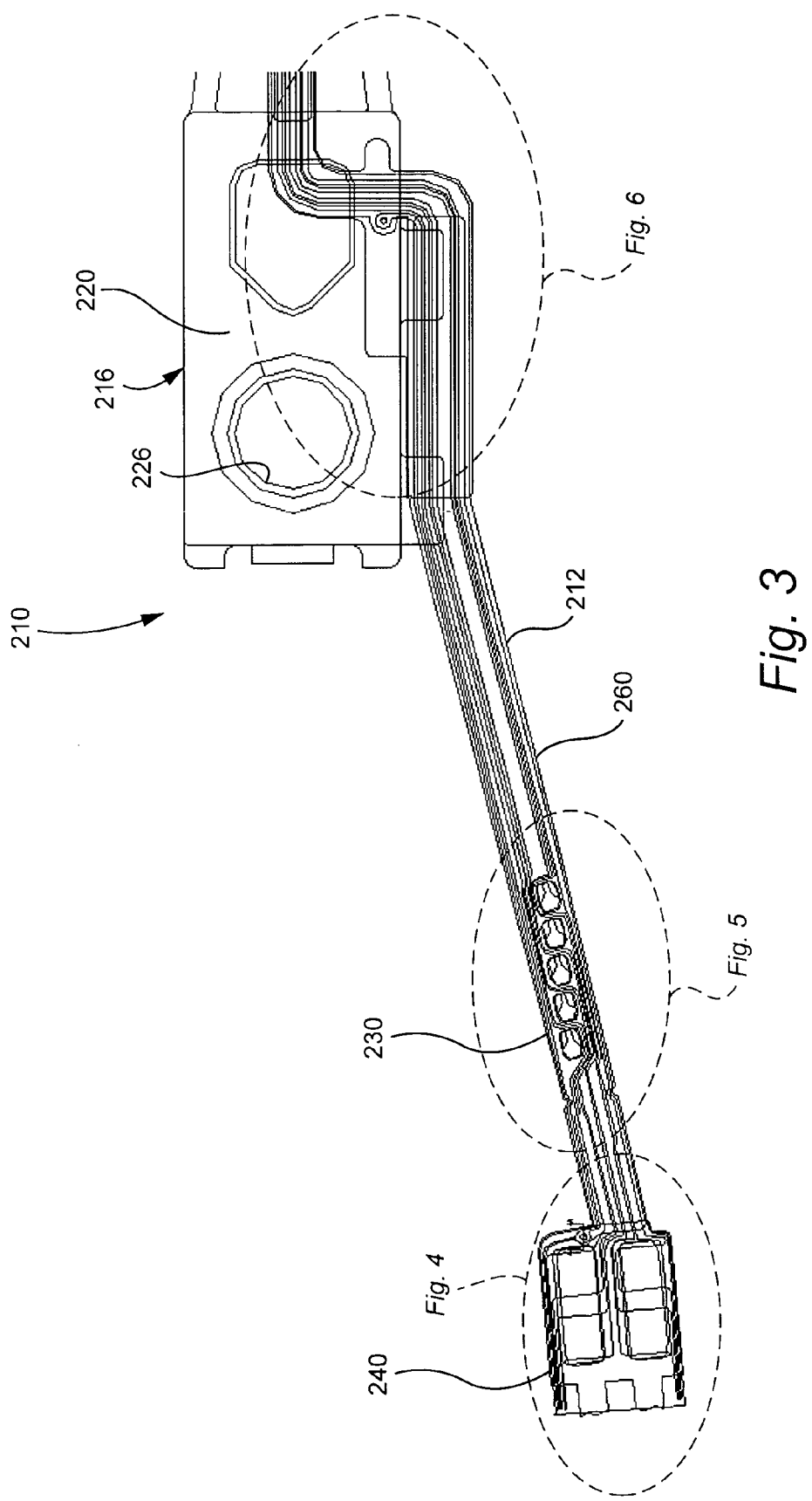
FIG. 3 is an enlarged top view of the HGA shown in FIG. 2 illustrating the tail of the FPC.

As shown in FIGS. 2 and 3, the FPC 212 is provided to the flexure 224 to electrically connect the slider 214 and its read/write elements to a conductive tab 230 (which connects to an external control system, e.g., a pre-amplifier circuit) and a test tab 240 (which connects to an external dynamic and/or static testing system). The FPC 212 includes a grounding trace or lead 250 that grounds the FPC 212 during manufacturing and testing processes to prevent ESD damage to the slider 214. In the illustrated embodiment, the FPC 212 and the flexure 224 are the same piece. Also, the FPC 212 and flexure 224 are formed of a stainless steel substrate like CIS or TSA (ILS), not FSA because FSA has no stainless steel substrate.

Specifically, the FPC 212 includes multiple traces or leads 218, e.g., four traces, that extend from the region 228 adjacent the slider 214, through the conductive tab 230, and to the test tab 240. As illustrated, the conductive tab 230 and test tab 240 are provided on a tail 260 of the FPC 212. It should be understood that the FPC 212 may include any suitable number of traces 218. The multiple traces 218 are electrically connected to the slider 214 and its read/write elements, conductive pads 232 (e.g., five pads) provided on the conductive tab 230 (see FIG. 5), and test pads 242 (e.g., four pads) provided on the test tab 240 (see FIG. 4). The multiple traces 218 may also be electrically connected to other devices in the region 228, e.g., a micro-actuator.

Figure 4:
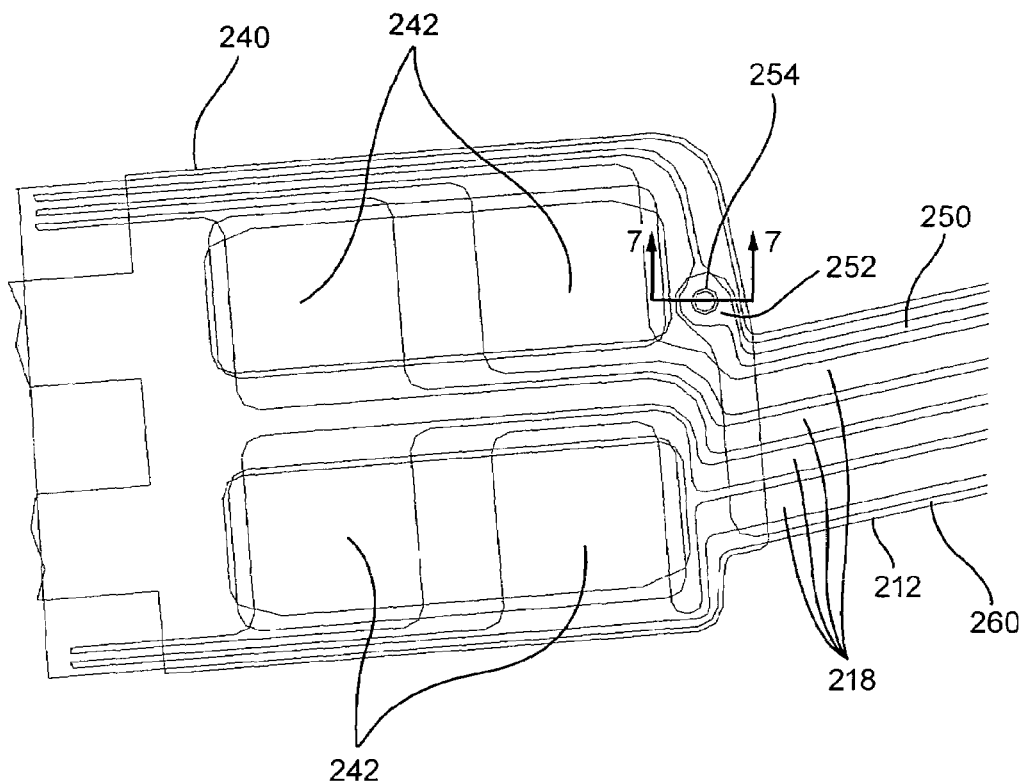
FIG. 4 is an enlarged portion of the HGA shown in FIG. 3 illustrating the test tab of the FPC.
Figure 5:
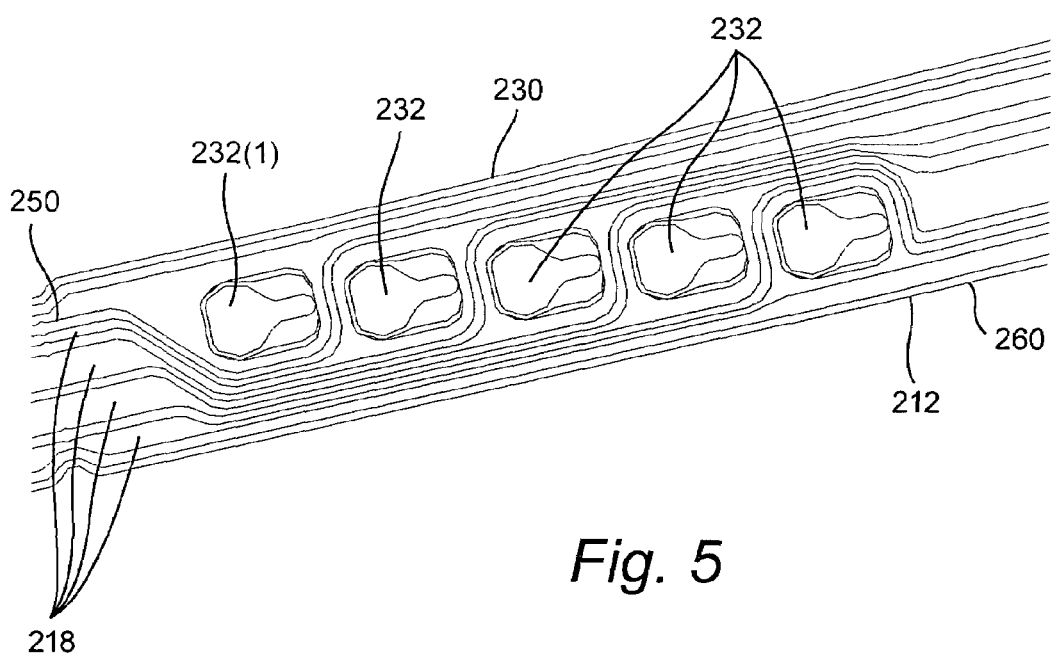
FIG. 5 is an enlarged portion of the HGA shown in FIG. 3 illustrating the conductive tab of the FPC.
Figure 6:
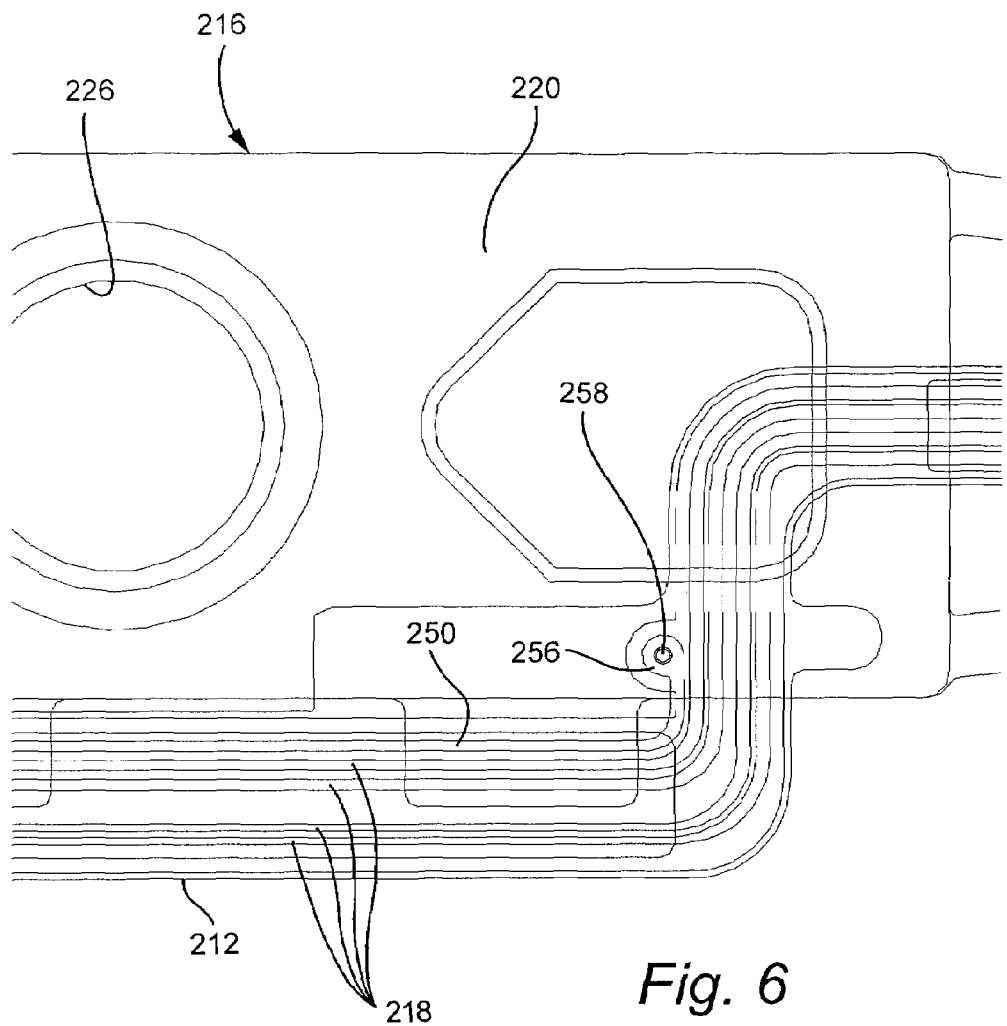
FIG. 6 is an enlarged portion of the HGA shown in FIG. 3 illustrating the base plate.

In addition, the FPC 212 includes a grounding trace or lead 250 that extends from the base plate 220, through the conductive tab 230, and to the test tab 240. Specifically, one end 252 of the grounding trace 250 is provided on the test tab 240 as shown in FIG. 4. The one end 252 is conducted or routed to a stainless steel layer of the test tab 240 through a grounding via 254. The other end 256 of the grounding trace 250 is provided on the base plate 220 as shown in FIG. 6. The other end 256 is conducted or routed to a stainless steel layer of FPC through a grounding via 258. Because the FPC is welded to the suspension base plate 220, the suspension base plate and the testing pad are well grounded. The intermediate portion of the grounding trace 250 extends through conductive pad 232 (1) on the conductive tab 230 as shown in FIG. 5.

Figure 7:
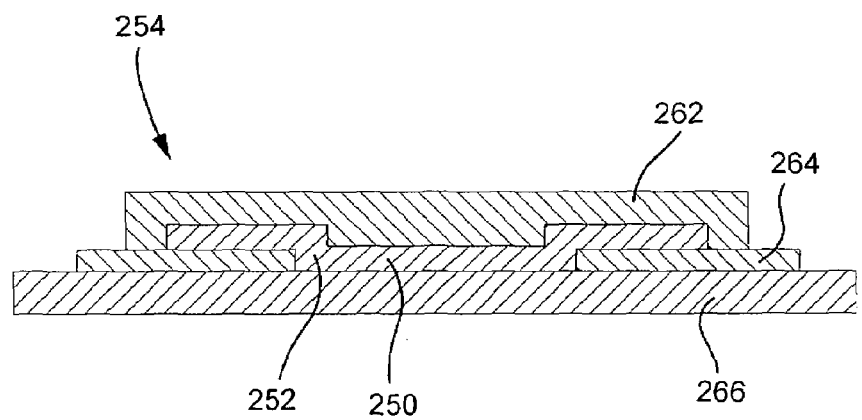
FIG. 7 is a cross-sectional view through line 7-7 in FIG. 4 illustrating a grounding via.

FIG. 7 illustrates an embodiment of the grounding via 254. As illustrated, the grounding via 254 includes a protective layer 262, a die layer 264, and a stainless steel layer 266. As illustrated, the end 252 of the grounding trace 250 is sandwiched between these layers 262, 264, 266. The stainless steel layer 266 on the bottom of the grounding via 254 facilitates the grounding connection and reinforces the FPC 212 around the grounding via 254. It is noted that the other grounding via 258 may have a similar construction.

The grounding trace 250 provides grounding in the test tab 240, the conductive tab 230, and the suspension base plate in order to reduce ESD during examination of the dynamic and/or static performance of the magnetic read/write elements on the slider 214, e.g., MR/GMR head with MR/GMR element. That is, the FPC 212 is electrically shunted and grounded on the test tab 240 during testing processes in order to prevent ESD damage.

The grounding trace 250 also provides grounding before and after testing to prevent ESD damage during manufacturing. For example, the FPC 212 is grounded at the testing tab 240 via the grounding trace 250 before the HGA 210 is tested. The FPC 212 continues to be grounded during testing processes as described above. After testing, the FPC 212 is shunted and grounded at the testing tab 240 before the HGA 210 is assembled to the disk drive device. The shunt may be easily disconnected after the conductive pads 232 are connected to an external control system, e.g., a pre-amplifier circuit, by cutting the tail 260 between the conductive tab 230 and the test tab 240.

The head gimbal assembly 210 incorporating the FPC 212 according to an embodiment of the present invention may be provided to a disk drive device (HDD). Because the structure, operation and assembly processes of disk drive devices are well known to persons of ordinary skill in the art, further details regarding the disk drive device are not provided herein so as not to obscure the invention. It is noted that the FPC 212 may be implemented in any suitable disk drive device having a FPC in which it is desired to prevent ESD damage, regardless of the specific structure of the HGA illustrated in the figures.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A head gimbal assembly, comprising:
   a slider;
   a suspension to support the slider; and
   a flexible printed circuit provided to the suspension, the flexible printed circuit including multiple traces to electrically connect the slider to a conductive tab and a test tab,
   wherein the flexible printed circuit includes a grounding trace to ground the flexible printed circuit at the test tab.

2. The head gimbal assembly according to claim 1, wherein the conductive tab includes multiple conductive pads.

3. The head gimbal assembly according to claim 1, wherein the test tab includes multiple test pads.

4. The head gimbal assembly according to claim 1, wherein the grounding trace extends from the suspension, through the conductive tab, and to the test tab.

5. The head gimbal assembly according to claim 4, wherein the grounding trace includes a first end conducted to a stainless steel layer of the test tab through a first grounding via and a second end conducted to a stainless steel layer of the flexible printed circuit through a second grounding via, the flexible printed circuit and a suspension base plate being welded together.

6. The head gimbal assembly according to claim 5, wherein at least one of the first and second grounding via includes a protecting layer, a die layer, and a stainless steel layer, the respective first and second end of the grounding trace being sandwiched between the protective, die, and stainless steel layers.

7. The head gimbal assembly according to claim 1, wherein the flexible printed circuit is grounded during a testing process.

8. The head gimbal assembly according to claim 1, wherein the flexible printed circuit is grounded before assembly to a disk drive device.

9. The head gimbal assembly according to claim 1, wherein the flexible printed circuit is grounded after a testing process and before assembly to a disk drive device.

10. A flexible printed circuit for a head gimbal assembly, comprising:
    multiple traces extending from a suspension of the head gimbal assembly, through a conductive tab, and to a test tab; and
    a grounding trace to provide grounding at the test tab.

11. The flexible printed circuit according to claim 10, wherein the conductive tab includes multiple conductive pads.

12. The flexible printed circuit according to claim 10, wherein the test tab includes multiple test pads.

13. The flexible printed circuit according to claim 10, wherein the grounding trace extends from the suspension, through the conductive tab, and to the test tab.

14. The flexible printed circuit according to claim 13, wherein the grounding trace includes a first end conducted to a stainless steel layer of the test tab through a first grounding via and a second end conducted to a stainless steel layer of the suspension through a second grounding via.

15. The flexible printed circuit according to claim 14, wherein at least one of the first and second grounding via includes a protecting layer, a die layer, and a stainless steel layer, the respective first and second end of the grounding trace being sandwiched between the protective, die, and stainless steel layers.

16. A method for testing a slider, the method comprising:
grounding a flexible printed circuit that electrically connects the slider to a test tab; and
testing the dynamic and/or static characteristics of the slider while the flexible printed circuit is grounded.

17. The method according to claim 16, further comprising maintaining grounding of the flexible printed circuit after testing and before assembly to a disk drive device.

* * * * *